(12) United States Patent
Sakai et al.

(10) Patent No.: US 8,703,513 B2
(45) Date of Patent: Apr. 22, 2014

(54) METHOD FOR MANUFACTURING LIGHT EMITTING APPARATUS, LIGHT EMITTING APPARATUS, AND MOUNTING BASE THEREOF

(71) Applicant: Stanley Electric Co., Ltd., Tokyo (JP)

(72) Inventors: Takaaki Sakai, Tokyo (JP); Shinichi Katano, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 14/017,056

(22) Filed: Sep. 3, 2013

(65) Prior Publication Data

US 2014/0004634 A1 Jan. 2, 2014

Related U.S. Application Data

(62) Division of application No. 12/817,939, filed on Jun. 17, 2010.

(30) Foreign Application Priority Data

Jun. 22, 2009 (JP) ................................. 2009-147905

(51) Int. Cl.
*H01L 21/00* (2006.01)

(52) U.S. Cl.
USPC ................... 438/33; 438/28; 438/29; 438/34; 438/113; 438/956; 257/84; 257/88; 257/98; 257/99

(58) Field of Classification Search
USPC ........... 438/33, 34, 27, 28, 22, 25, 29, 35, 39, 438/42, 956, 110, 113, 114, 121, 124, 127, 438/128, 106, 107, 108, 109; 257/79, 80, 257/81, 82, 84, 88, 99, 100, 678, 723, 778, 257/787, 788, 791, 792, 793
See application file for complete search history.

(56) References Cited

U.S. PATENT DOCUMENTS 8,088,635 B2 * 1/2012 Fushimi et al. ................. 438/22
2004/0180459 A1 9/2004 Hsu (Continued)

FOREIGN PATENT DOCUMENTS

JP 2000-58924 A 2/2000
JP 2005-535135 A 11/2005

(Continued)

OTHER PUBLICATIONS

Japanese Office Action for the related Japanese patent application No. 2009-147905 dated Mar. 19, 2013.

*Primary Examiner* — Thanh Y Tran
(74) *Attorney, Agent, or Firm* — Kenealy Vaidya LLP (57) ABSTRACT

A metal plate is prepared, on which at least one joint slit made up of a joint and an opening is formed in a predetermined direction for integrating multiple mounting plates of the light emitting apparatuses. Multiple light emitting elements set in array are mounted on the metal plate. An aperture is provided at a position corresponding to a position for mounting the light emitting element on the metal plate, and a plate-like reflector made of resin, on which a first reflector splitting groove is formed at a position coinciding with the joint slit of the metal plate, is mounted and fixed on the metal plate in such a manner as superimposed thereon. The metal plate and the resinous reflector are superimposed one on another and broken together, whereby the metal plate can be split successfully.

8 Claims, 9 Drawing Sheets

(56) References Cited

U.S. PATENT DOCUMENTS

| | | |
|---|---|---|
| 2006/0071318 A1 | 4/2006 | Yamamura |
| 2006/0091416 A1 | 5/2006 | Yan |
| 2007/0241362 A1 | 10/2007 | Han et al. |
| 2009/0090928 A1* | 4/2009 | Mori et al. ............ 257/99 |
| 2010/0038662 A1 | 2/2010 | Fushimi et al. |

FOREIGN PATENT DOCUMENTS

| | | |
|---|---|---|
| JP | 2006-108341 A | 4/2006 |
| JP | 2006-128701 A | 5/2006 |
| JP | 2008-258567 A | 10/2008 |
| WO | 2004/015769 A1 | 2/2004 |

* cited by examiner

FIG. 6(b) SINGLE LED

FIG. 6(c) MULTIPLE LEDs PATTERN 1

FIG. 6(d) MULTIPLE LEDs PATTERN 2

METHOD FOR MANUFACTURING LIGHT EMITTING APPARATUS, LIGHT EMITTING APPARATUS, AND MOUNTING BASE THEREOF

This application is a divisional application claiming the priority benefit under 35 U.S.C. §120 to co-pending and commonly assigned U.S. patent application Ser. No. 12/817,939 filed on Jun. 17, 2010, which claims the priority benefit under 35 U.S.C §119 of Japanese Patent Application No. 2009-147905 filed on Jun. 22, 2009, both of which are hereby incorporated in their entirety by reference.

FIELD OF THE INVENTION

The present invention relates to a method for manufacturing a light emitting apparatus on which a light emitting diode (LED) is mounted, and more particularly, it relates to a method for manufacturing a light emitting apparatus on which multiple LEDs are mounted in the form of line.

DESCRIPTION OF THE RELATED ART

Japanese Unexamined Patent Application Publication No. 2000-58924 (hereinafter, referred to as "patent document 1") discloses that a thin sheet metal is employed as a mounting plate in order to enhance a heat radiation effect of the mounting plate on which the LED is mounted. The thin sheet metal is separated into two electrode areas according to a slit which is created by a press work, and one of the electrode areas is processed into a concave, being a mortar shape, which serves as a reflector. An LED is die-bonded at the center of the concave portion. The other electrode area is connected to a topside electrode of the LED via a bonding wire. At the time of manufacturing, a heat-resistant film is affixed to the back of the mounting plate having the slit thereon, and after the die-bonding and wire-bonding of the LED, all over the top surface is sealed by an epoxy resin. Accordingly, the slit is also filled with the epoxy resin. Subsequently, dicing is performed to separate the mounting plate to individual LEDs. Since the insulating heat-resistant film and the epoxy resin establish a joint at the slit, even when dicing is performed for separation, it is possible to maintain the coupling between the two electrode areas.

On the other hand, Japanese Unexamined Patent Application Publication No. 2006-108341 (hereinafter, referred to as "patent document 2") discloses a method for manufacturing a semiconductor device and dicing is not performed in this method. In other words, perforation-like grooves are provided in length and breadth on the wiring mounting plate in advance, semiconductor substrates are respectively mounted on the areas partitioned by the perforation-like grooves, and a layer of encapsulation resin is provided on the top. According to this method, both the wiring mounting plate and the layer of encapsulation resin are broken along the perforation, so as to divide the wiring mounting plate.

As for the light emitting apparatus which uses the thin sheet metal as the mounting plate as described in the patent document 1, it is necessary to cut off and divide the metallic mounting plate by a dicing blade to obtain an individual light emitting apparatus. When the mounting plate is cut off by dicing, there is a problem that cuttings are generated and it may adhere to a light emitting surface of the LED.

On the other hand, when the technique of the patent document 2 is applied to the light emitting element, i.e., the perforation-like grooves are provided on the wiring mounting plate and the wiring mounting plate is broken and separated, stress on the mounting plate upon breaking may be added to the LED and bonding wire, and there is a possibility of problem occurrence, such as failing in illuminating. If the mounting plate is made of metal, it is difficult to break the mounting plate due to ductility of metal, even though the perforation-like grooves are provided.

An aspect of the present invention is to provide a method for manufacturing a light emitting apparatus in which the mounting plate can be separated by breaking (being forced apart), even in the case where a metallic mounting plate is employed.

SUMMARY OF THE INVENTION

The present invention provides a method for manufacturing a light emitting apparatus as described below.

In other words, the method for manufacturing the light emitting apparatus has a step of preparing a metal plate on which at least one joint slit made up of a joint and an opening is provided in a predetermined direction, the joint integrating multiple mounting plates of the light emitting apparatuses, a step of mounting multiple light emitting elements on the metal plate in such a manner as set in array, a step of mounting and fixing a plate-like reflector made of resin on the metal plate in a superimposed manner, the plate-like reflector being provided with an aperture at a position corresponding to a position for mounting the light emitting element on the metal plate, and having a first reflector splitting groove formed on a position coinciding with the joint slit of the metal plate, and a step of breaking the metal plate and the plate-like reflector being superimposed and fixed one on another, along the joint slit of the metal plate and along the first reflector splitting groove of the plate-like reflector.

As thus described, since the metal plate and the plate-like reflector made of resin are superimposed and fixed one on another, so as to be broken together, it is possible to facilitate breaking of the metal plate.

It is further possible to configure such that a plate splitting groove orthogonal to the joint slit is formed on the metal plate, and a second reflector splitting groove is formed on the plate-like reflector at a position coinciding with the plate splitting groove. With this configuration, it is further possible to break along the plate splitting groove and the second reflector splitting groove.

The first reflector splitting groove and/or the second reflector splitting groove can be formed from both faces of the reflector, each being a V-shape groove.

It is possible to perform a step of forming an insulating slit on the metal plate, in addition to the joint slit, in order to electrically separate the metal plate into two areas after being split, and filling insulating resin into the insulating slit before the step of mounting the light emitting elements, or after the mounting step and before the step of fixing the plate-like reflector.

It is further possible to perform a step of establishing connection via a bonding wire, between a topside electrode of the light emitting element which is mounted in the mounting step and a bonding pad which is provided in the area on the side opposed to the light emitting element, placing the insulating slit therebetween.

Preferably, by extending a region where the light emitting element and the bonding wire are positioned on the metal plate in a direction virtually perpendicular to the longitudinal direction of the joint slit, the region being a band-like shape defined on the metal plate, so that the joint described above is arranged at a position deviated from the band-like region.

This configuration aims to avoid application of stress on the light emitting element and the bonding wire when the breaking is performed.

A V-shaped notch may be provided from at least one side of the joint, and a cross section of the first reflector splitting groove may be formed also in the V-shape. Therefore, it is desirable that the plate-like reflector and the metal plate are fixed in such a manner that the notch coincides with the first reflector splitting groove.

In the breaking process, any of the plate splitting groove and the joint slit may be selected for the breaking.

According to another aspect of the present invention, a light emitting apparatus is provided as described below. In other words, this light emitting apparatus includes a metallic mounting plate having an insulating slit filled with insulating resin, a light emitting element mounted on the mounting plate, and a reflector made of resin arranged on the mounting plate and provided with an aperture at the position corresponding to the position for mounting the light emitting element, the light emitting apparatus being provided with a protrusion on the side surface orthogonal to the insulating slit of the mounting plate, and an inclined plane is formed on the end of the protrusion.

It is possible to configure such that the light emitting element is mounted on any one of a first area and a second area of the mounting plate being electrically separated by the insulating slit, one electrode of the light emitting element is electrically connected via the bonding wire to any one of the first area and the second area of the mounting plate, where the light emitting element is not mounted, and the protrusion is formed on each of the first area and the second area of the mounting plate.

According to a further alternative aspect of the present invention, a mounting base for multiple light emitting apparatuses is provided as described below. In other words, the present invention is also directed to the mounting base for multiple light emitting apparatuses, having at least one joint slit made up of a joint and an opening for integrating multiple metallic mounting bases of the light emitting apparatuses, where the joint is provided with a notch from at least one face thereof.

BRIEF DESCRIPTION OF DRAWINGS

FIG. 2(a) to FIG. 2(f) are perspective views showing steps of manufacturing the line-shaped light emitting apparatus according to the first embodiment;

FIG. 7(a) to FIG. 7(f) are perspective views showing steps of manufacturing the line-shaped light emitting apparatus according to the second embodiment;

FIG. 9(a) to FIG. 9(f) are perspective views showing steps of manufacturing the line-shaped light emitting apparatus according to the third embodiment.

DESCRIPTION OF THE EXEMPLARY EMBODIMENTS

Exemplary embodiments of the present invention will be explained with reference to the accompanying drawings.

First Embodiment

In the first embodiment, a method for manufacturing a line-shaped light emitting apparatus will be explained.

Figure 1:
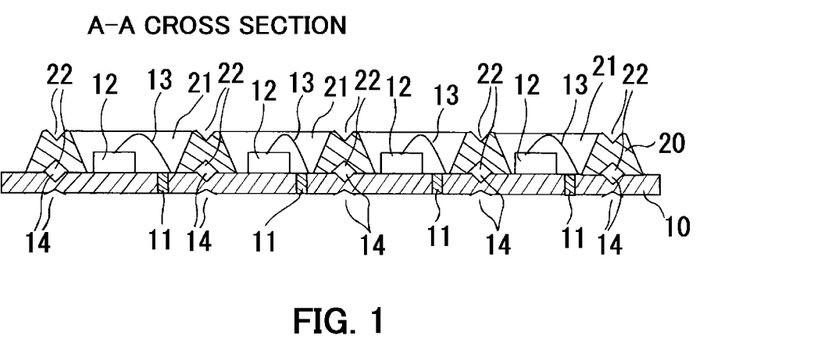
FIG. 1 is a sectional view of a line-shaped light emitting apparatus according to a first embodiment of the present invention.

As illustrated by the sectional view of FIG. 1 and the perspective view of FIG. 2(f), the line-shaped light emitting apparatus incorporates a mounting plate 10 made of metal, four LED elements 12 mounted in a line in the longitudinal direction of the mounting plate 10, and a plate-like reflector 20 made of resin mounted in such a manner as superimposed on the mounting plate 10. The plate-like reflector 20 is provided with four apertures 21 each being a mortar shape and the reflector is mounted on the mounting plate 10 in such a manner that the LED elements 12 are positioned respectively in the apertures 21 at the center thereof.

Figure 3:
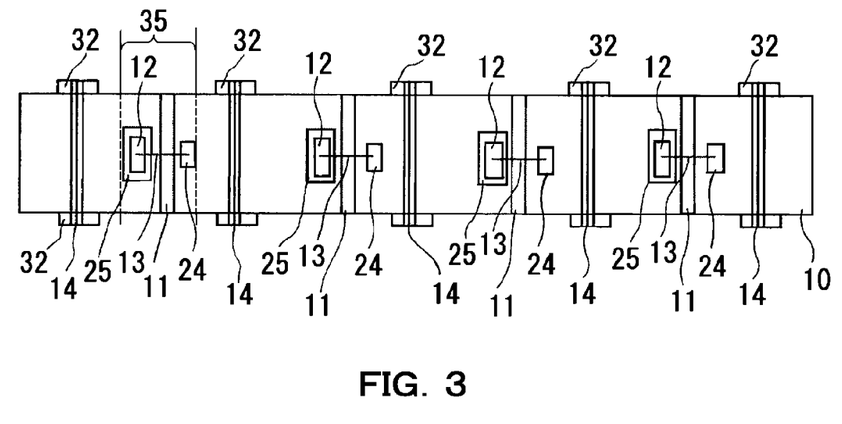
FIG. 3 is a top view showing a configuration where a reflector is removed from the line-shaped light emitting apparatus as shown in FIG. 1.

As illustrated by the top view of the mounting plate 10 in FIG. 3, the mounting plate 10 made of metal is provided with four insulating slits 11 which are orthogonal to the longitudinal direction of the mounting plate 10, respectively in proximity to the four LED elements 12. The insulating slit 11 is filled with insulating resin. A wire bonding pad 24 is arranged at a position on the mounting plate 10, adjacent to the LED element 12, placing the insulating slit 11 therebetween. And a bonding wire 13 from the LED element 12 is installed on the wire bonding pad 24, crossing the insulating slit 11.

In the line-shaped light emitting apparatus according to the present embodiment, there are arranged between the insulating slit 11 and the LED element 12, splitting V-shaped grooves 14 respectively on both faces of the mounting plate 10, and splitting V-shaped grooves 22 respectively on both faces of the reflector 20, in order that the light emitting apparatus arranging the four LED elements in the form of line is allowed to be separated one by one, into four apparatuses. The direction of the splitting V-shaped grooves 14 and 22 are parallel to the insulating slit 11. The splitting groove 14 and the splitting groove 22 are provided at the positions coinciding with each other.

Next, with reference to FIG. 2(a) to FIG. 2(f), FIG. 4, and FIG. 5, the method for manufacturing the line-shaped light emitting apparatus according to the present embodiment will be further explained.

Figure 4:
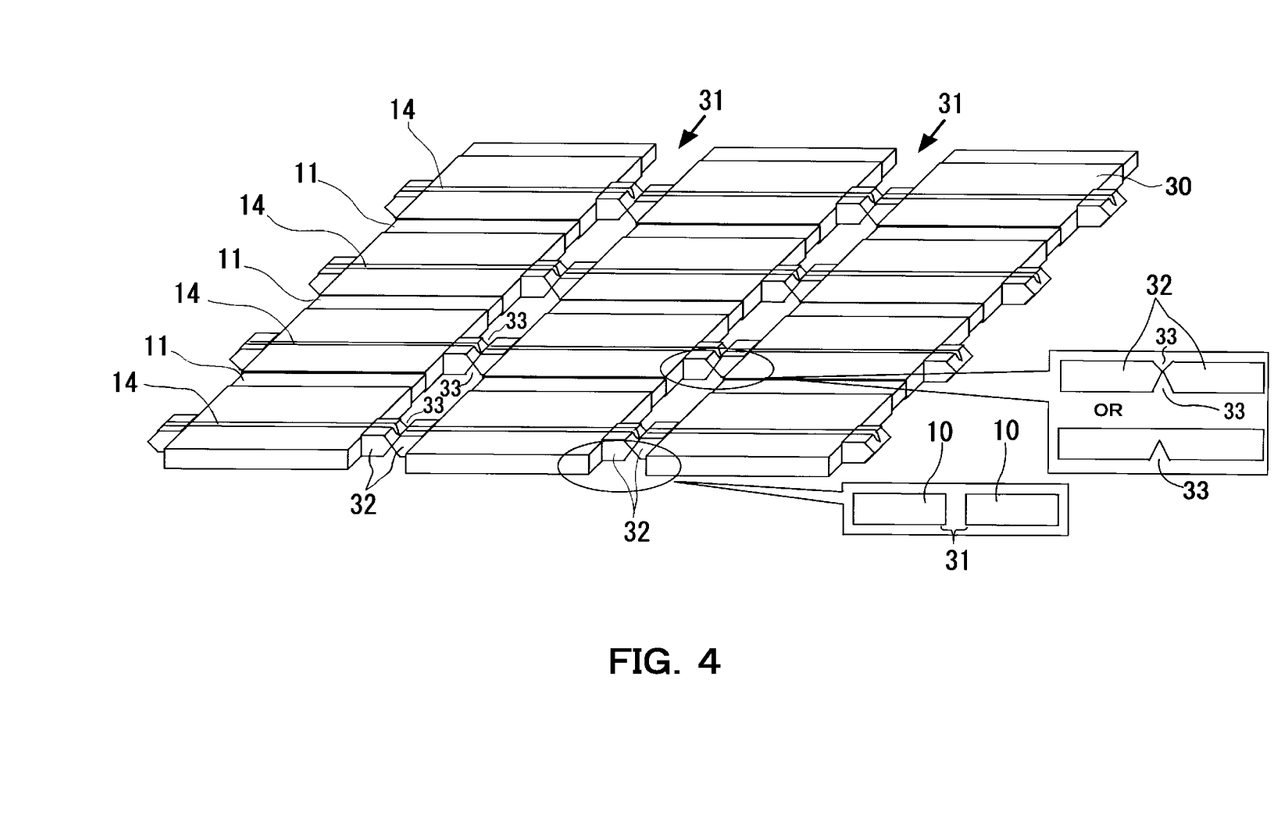
FIG. 4 is an enlarged perspective view of a mounting plate 10 as shown in FIG. 2(a)

As shown in FIG. 2(a) and FIG. 4, a metal plate 30 is prepared which serves as the mounting plate 10 after the separation. The metal plate 30 is a plate-like member made of metal, and preferably, it is made of a material having high thermal conductivity and high reflectivity, as well as being easy to be worked on. By way of example, a plate as described below may be employed; a plate obtained by applying Ni plated layer coating to a plate made of Cu, and coating of Ag plated layer or Au plated layer is additionally applied thereto, or a plate made of Al. Thickness of the mounting plate 10 may be decided from the viewpoint of workability and radiation performance. For example, it is set to around 0.1 mm to 1 mm. It is to be noted that in the following explanation, the mounting plate before separation is referred to as the "metal plate 30" and the mounting plate after separating the metal plate 30 is referred to as the "metallic mounting plate 10".

On the metal plate 30, as shown in FIG. 3, the die bonding pad 25 and the wire bonding pad 24 are formed in advance, in such a manner that the portion where the insulating slit 11 is to be formed is placed therebetween, on each of the metallic mounting plate 10 after the separation.

Figure 2:
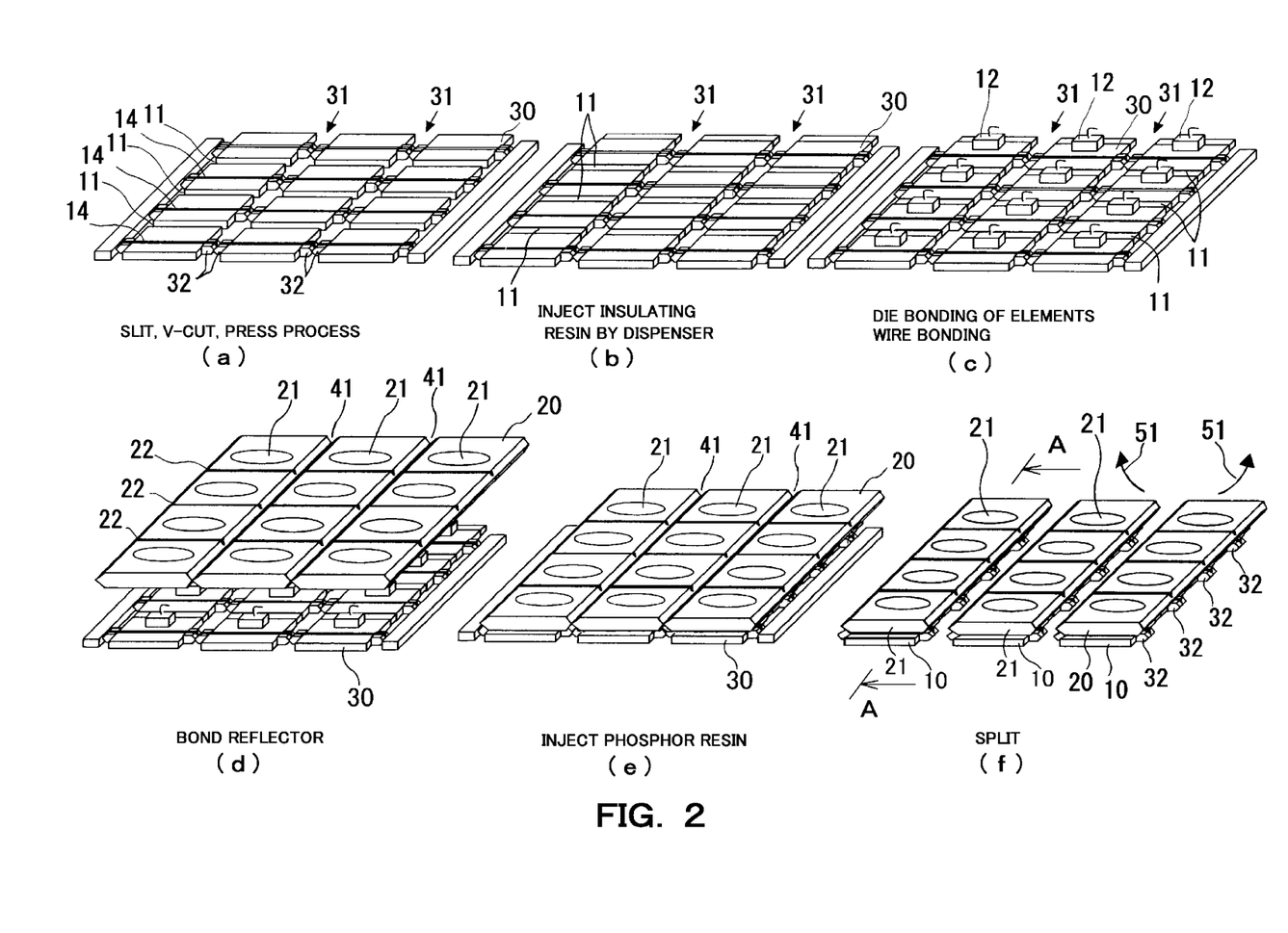

As shown in FIG. 2(*a*) and FIG. 4, firstly in the manufacturing method according to the present embodiment, a pressing process or an etching process is applied to a sheet of the metal plate 30. Multiple joint slits 31 are hereby created, and multiple insulating slits 11 and multiple splitting V-shaped grooves 14, which are orthogonal to the joint slits 31 are also created. Since the joint slit 31 made up of the opening and the joint 32 is formed in the form of a narrow line, the metal plate 30 has a configuration that arranges metallic mounting plates 10 in the form of line, and metallic mounting plates 10 are integrally joined by the joint 32. As shown in FIG. 4, the joint 32 is provided with V-shaped notches 33 respectively from both faces. Multiple insulating slits 11 are formed in the direction orthogonal to the joint slit 31.

The splitting V-shaped groove 14 is formed in parallel to each of the multiple insulating slits 11 with a certain spacing therebetween. As shown in FIG. 1, the splitting V-shaped groove 14 is formed on each of both faces of the metal plate 30. It is desirable to design the depth of the splitting V-shaped groove 14 with the aim of making the residual thickness of the metallic mounting plate 10 to be 0.15 mm or less, from the viewpoint to facilitate the splitting. However, if there is a purpose to keep a particular V-shaped groove 14 to remain without being broken off, in the light emitting apparatus after the splitting step, so as to establish electrical connection via the V-shaped groove 14, it is desirable to make the residual thickness to be 0.10 mm or more in order to avoid occurrence of breaks on this particular V-shaped groove.

The V-shaped notch 33 of the joint 32 and the splitting V-shaped groove 14 may be formed by notching by a dicing blade from both faces of the metal plate 30, as an alternative way to the press process or the etching process.

Furthermore, the V-shaped notch 33 and the splitting V-shaped groove 14 are not necessarily formed on both faces, and they may be formed only on the underside or only on the upper side.

Next, in the step as shown in FIG. 2(*b*) and in FIG. 4, an insulating adhesive agent is injected into each of the insulating slits 11 by using a dispenser. As the insulating adhesive agent, it is preferable to employ an adhesive having high heat resistance, high reliability, and high reflectivity for efficiently outputting light from a chip to the outside, as well as high thermal conductivity for efficiently radiating heat generated from the chip. For example, it is suitable to use an adhesive agent obtained by dispersing alumina particles in silicone-based resin, or a ceramic-based inorganic adhesive agent.

Next, in the process as shown in FIG. 2(*c*), the LED element 12 is die-bonded on the die bonding pad 25 on the metal plate 30 via a conductive resin adhesive agent. As the conductive resin adhesive agent, an epoxy-based resin adhesive agent (Ag paste) in which Ag particles are dispersed or a silicone-based resin adhesive agent may be employed, for instance. Thereafter, the bonding wire 13 is connected from the topside electrode of the LED element 12 to the wire bonding pad 24 which is located on the opposite side crossing the insulating slit 11.

Figure 5:
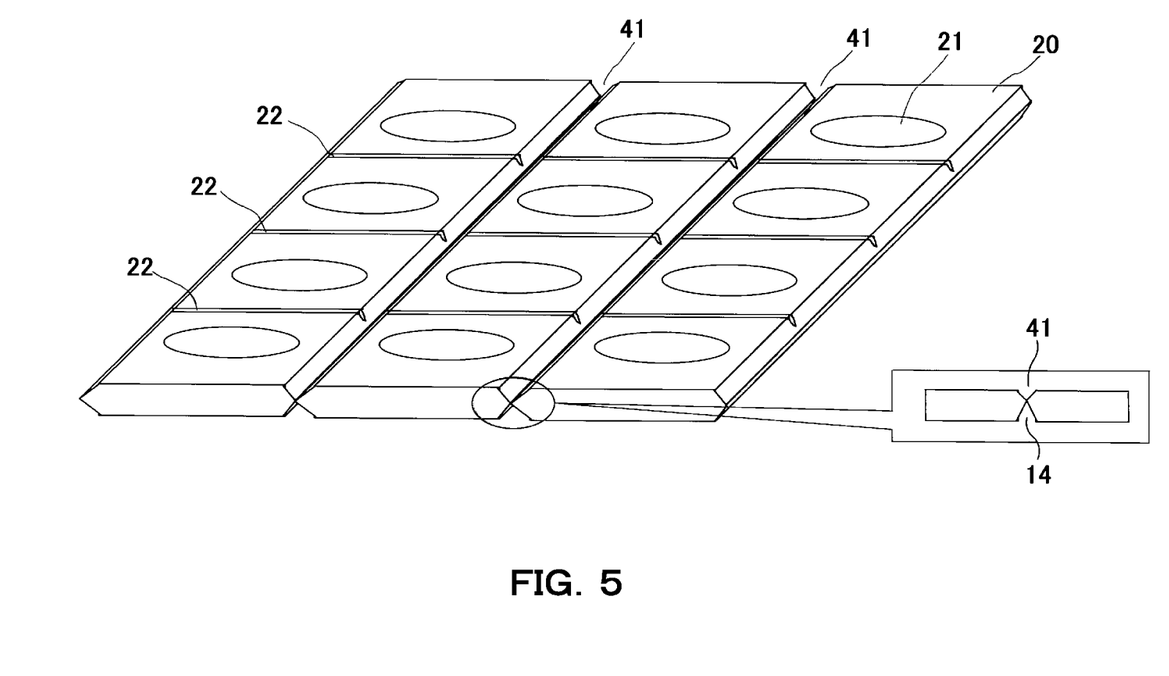
FIG. 5 is an enlarged perspective view of a reflector 20 as shown in FIG. 2(d)

In the meantime, in the step as shown in FIG. 2(*d*) and FIG. 5, the V-shaped groove 41 is created on each of both faces of the reflector 20 made of resin, which has been produced separately. The position where the V-shaped groove 41 is provided coincides with the joint slit 31 of the metal plate 30, and preferably, this position also coincides with the V-shaped groove 33. Furthermore, the reflector 20 is provided with a splitting V-shaped groove 22 at a position which coincides with the position of the splitting V-shaped groove 14 of the metal plate 30. For example, dicing creates the V-shaped grooves 41 and 22. The V-shape is preferable for the notch for splitting the reflector, since pressure is applied when the reflector 20 is adhered to the metal plate 30. The residual thickness of the reflector 20 where the V-shaped grooves 41 and 22 are provided from each of both faces is preferably 0.15 mm or less. The resin for constituting the reflector 20 may be suitably PPA (polyphthalamide resin), PA (polyamide resin), PPS (polyphenylene sulfide resin), and LCP (liquid crystalline polymer resin), any of those being white in color by pigment for enhancing the reflectivity. It is further possible to provide a reflecting layer on the inner wall of the aperture 21 of the reflector 20 made of resin in order to enhance the reflectivity.

An adhesive agent (e.g., silicone-based adhesive) is applied to the surface of the metal plate 30 on which the reflector 20 is bonded. Accordingly, a laminated body is formed, in which the position of the joint slit 31 of the mounting plate 10 coincides with the position of the V-shaped groove 41 of the reflector 20. The splitting V-shaped groove 14 of the metal plate 30 and the splitting V-shaped groove 22 of the reflector 20 also coincide in position.

Thereafter, in the step as shown in FIG. 2(*e*), a transparent resin in which a phosphor is dispersed is filled in the aperture 21 of the reflector 20, and then the resin is cured. The phosphor to be used here emits fluorescence having a predetermined wavelength, utilizing light from the LED element 12 as exciting light.

Finally, as shown in FIG. 2(*f*), splitting is performed by hand, along the joint slit 31 of the metal plate 30 and the V-shaped groove 41 of the reflector 20. On this occasion, as indicated by the arrows 51 as shown in FIG. 2(*f*), when folded in such a manner that the reflector side becomes inside, in such a manner that the notch 33 on the backside of the joint 32 of the metal plate 30 is expanded, the center of the V-shaped grooves 41 on both faces of the reflector 20 made of resin serve as a supporting point and further expands the notch 33 on the backside of the joint 32 of the metal plate 30, thereby giving a large force onto the joint 32. When such large force breaks the joint 32 of the metal plate 30, the V-shaped groove 41 of the resinous reflector 20 is also folded and broken. Accordingly, the metal plate 30 is easily split, and the line-shaped mounting plate 10 and the reflector 20 can be obtained.

As thus described, the resinous plate-like reflector 20 with small ductibility is bonded on the metal plate 30, and the reflector 20 and the metal plate 30 are simultaneously broken. Therefore, even though the metal plate 30 is made of a metal having ductibility, it is easily split to obtain the line-shaped mounting plate 10. Instead of splitting by hand, it is possible to split by punching.

When the metal plate 30 is broken, it is desirable that the joint slit 31 and the joint 32 are arranged at the position that does not overlap the region 35 where the wire bonding pad and the LED element 12, and the bonding wire 13 are arranged, as shown in FIG. 3, in order to avoid application of stress to the LED element 12 and the wire 13. In other words, it is desirable that the region where the LED element 12 and the bonding wire 13 are arranged on the metal plate 30 (metallic mounting plate 10) is virtually extended in the direction perpendicular to the longitudinal direction of the joint slit 31, so that the joint 32 is arranged at a position that does not overlap the band-like region 35 defined on the metal plate 30 (metallic mounting plate 10). In the present embodiment, the joint 32 is arranged at the position where the splitting V-shaped groove 14 of the metal plate 30 is provided.

Since the notch 33 is provided in V-shape on the joint 32, a force applied to the metal plate 30 can be reduced when the breaking is performed, and there is further an effect that the stress is uniformly dispersed, whereby it becomes more difficult to apply stress on the LED element and the wire.

As shown in FIG. 2(f), the joint 32 remains after the division, in the form of protrusion on the side surface of the line-shaped light emitting apparatus. Therefore, in the case where it is used as an LED light source such as a liquid crystal back light source, the joint 32 can be utilized as a section for installing wiring and terminals, thereby facilitating the installation and power feeding. In addition, when the mounting plate 10 of the line-shaped light emitting apparatus is implemented on another mounting plate or the like by soldering, the joint 32 may form a soldering fillet and increase a bonding area, thereby increasing joining strength.

As thus described, in the manufacturing method according to the first embodiment, even though the mounting plate 10 is made of metal, the light emitting apparatus can be obtained just by splitting the metal plate 30 and the reflector without dicing, and the line-shaped light emitting apparatus as shown in FIG. 1 and FIG. 2(f) can be easily manufactured. Therefore, it is possible to prevent adhesion of cuttings, which are generated by dicing, on the surface of the LED element 12, and the fabrication yield can be improved.

The line-shaped light emitting apparatus as shown in FIG. 1 and FIG. 2(f) has a configuration that the LED elements 12 being adjacent are connected in series.

Figure 6A:
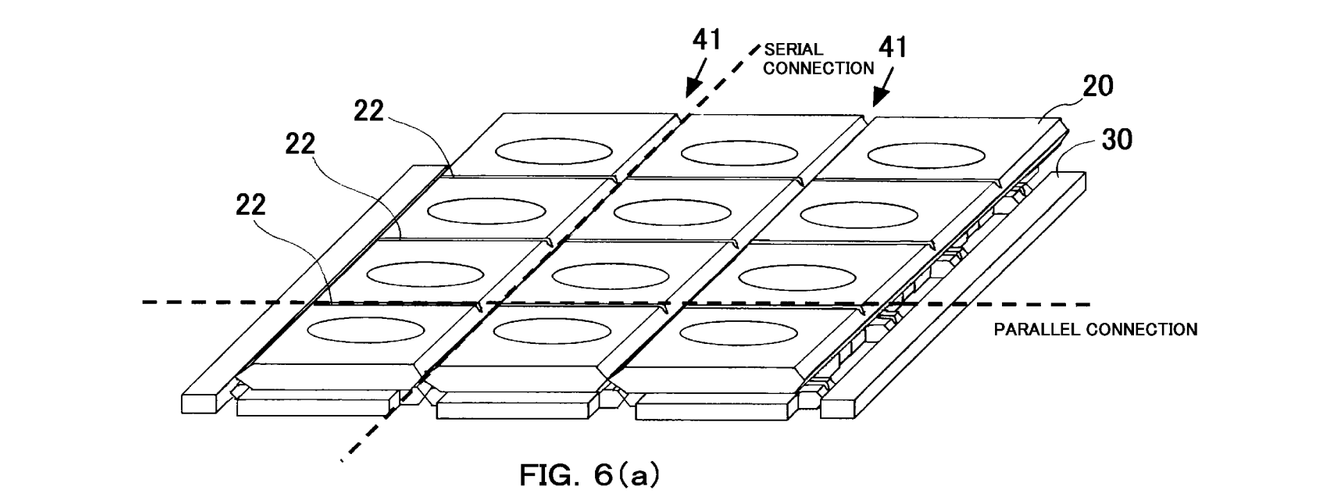
FIG. 6(a) illustrates separation of a laminated body made up of the mounting plate 10 and the reflector 20, along two directions.

As shown in FIG. 6, the metal plate 30 and the reflector 20 of the present embodiment are provided with the splitting V-shaped grooves 14 and 22 in the direction orthogonal to the joint slit 31. Therefore, further division at the position of the splitting V-shaped grooves 14 and 22 are possible. On the other hand, the metal plate 30 and the reflector 20 may be separated only along the splitting V-shaped grooves 14 and 22 without separated in the direction of the joint slit 31 and the V-shaped groove 41. In this case, a line-shaped light emitting apparatus in parallel connection can be obtained.

Figures 6B, 6C, 6D:
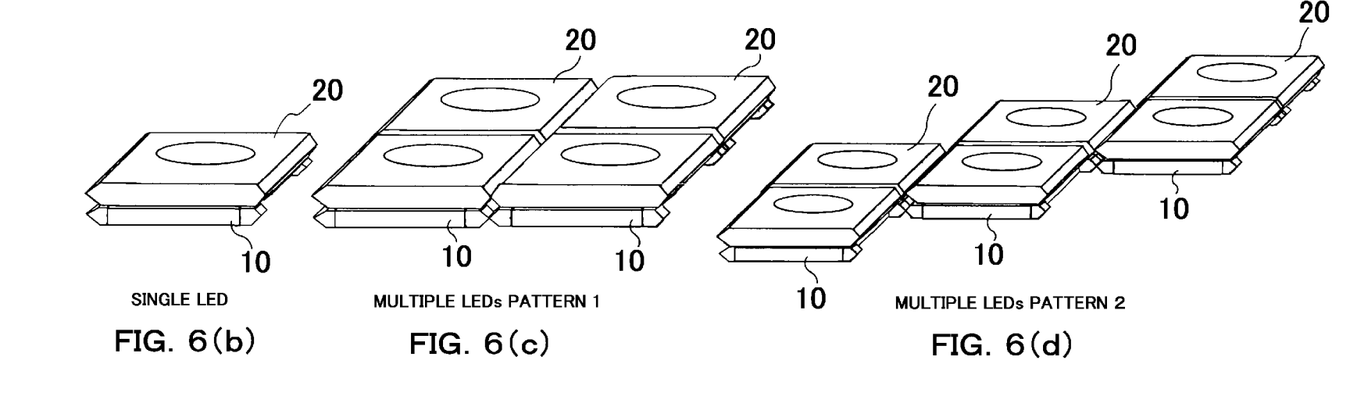
FIG. 6(b) is a perspective view of the light emitting apparatus provided with only one LED element.
FIG. 6(c) is a perspective view of the light emitting apparatus provided with the LED elements arranged in two by two.
FIG. 6(d) is a perspective view showing the light emitting apparatus having two LED elements in series, the pair being arranged in parallel in step wise.

As shown in FIG. 6(b), it is further possible to manufacture the light emitting apparatus on which only one LED element 12 is mounted, by splitting the metal plate 30 and the reflector 20 at the position of the joint slit 31 and thereafter splitting at the position of the splitting V-shaped groove 14, since the split position can be selected freely. As shown in FIG. 6(c), the light emitting apparatus having a mixed array, in series and in parallel, may also be manufactured by splitting into the shape where the LED elements are arranged in the array of two by two. As shown in FIG. 6(d), it is further possible to obtain the light emitting apparatus which has two LED elements 12 in series are connected in parallel in step-wise.

In the present embodiment, there has been explained an example that the metal plate 30 and the reflector 20 are provided with the joint slit 31, the splitting V-shaped grooves 14 and 22, the V-shaped groove 41 in two directions being orthogonal, in order to increase flexibility in selecting the direction of splitting. However, if it is determined in advance to manufacture a line-shaped light emitting apparatus in a predetermined direction, it is sufficient to provide the joint slit 31, the splitting V-shaped grooves 14 and 22, and the V-shaped groove 41 only for the direction of the determined line.

As described above, the method for manufacturing the LED light emitting apparatus of the present embodiment can be achieved by forming a simple slit or V-shaped groove on the metal plate 30 and the reflector 20, and injecting insulating resin in simple manner by a dispensing method. In addition, the metal plate 30 and the reflector 20 can be split by hand or the like, without using the dicing process. Therefore, an LED light emitting apparatus having a desired array such as a line shape can be easily manufactured at low cost, together with an effect that both reliability and versatility are high.

Second Embodiment

Next, the second embodiment of the present invention will be explained.

The first embodiment is directed to a procedure that the insulating adhesive is injected into the insulating slit 11 by the dispensing method in the step shown in FIG. 2(b), and the adhesive agent is coated on the surface of the metal plate 30 in the step shown in FIG. 2(d), so as to bond the reflector 20 thereon. In the second embodiment, the step of FIG. 2(b) and the step of FIG. 2(d) are integrated to one step.

Figure 7:
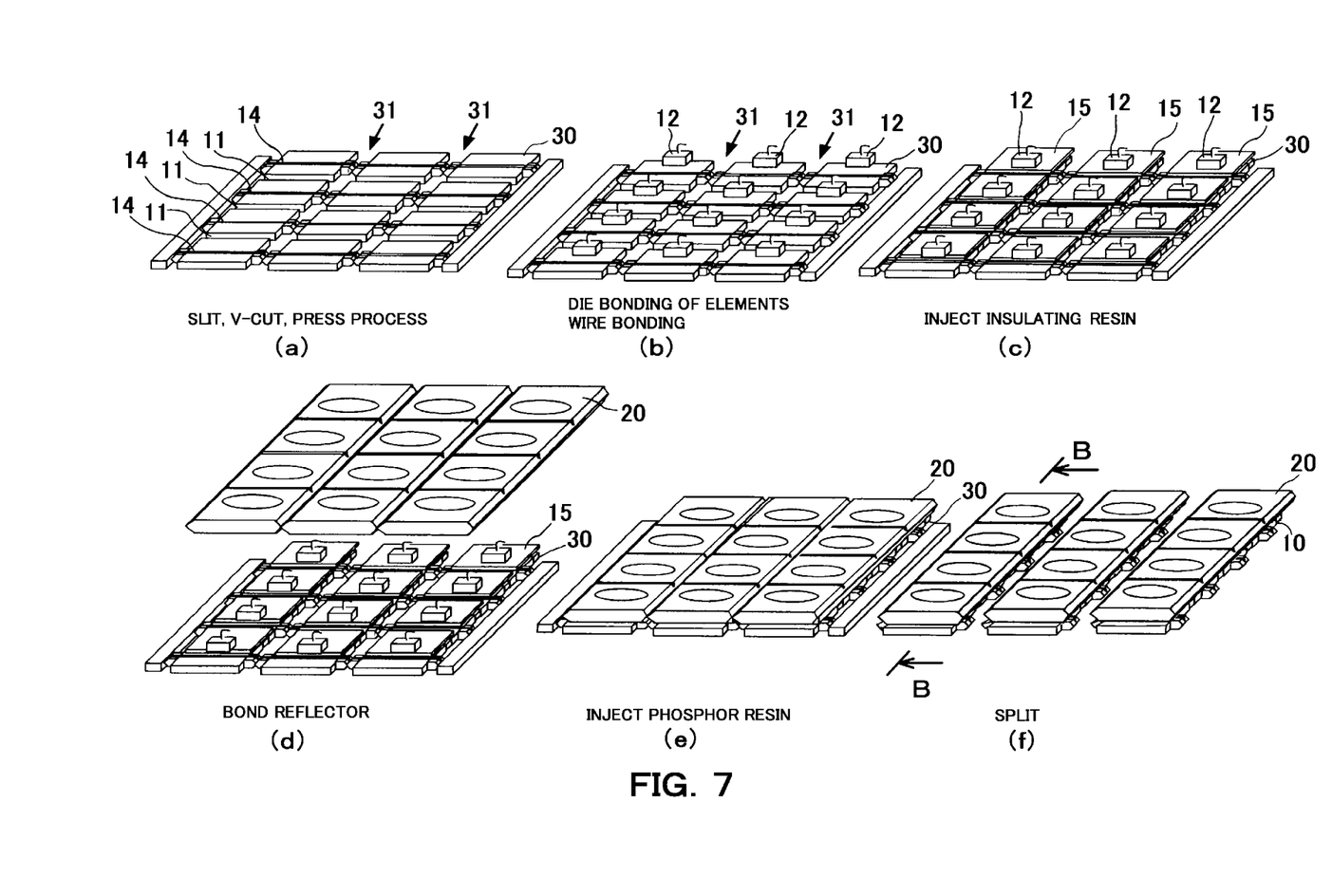
Figure 8:
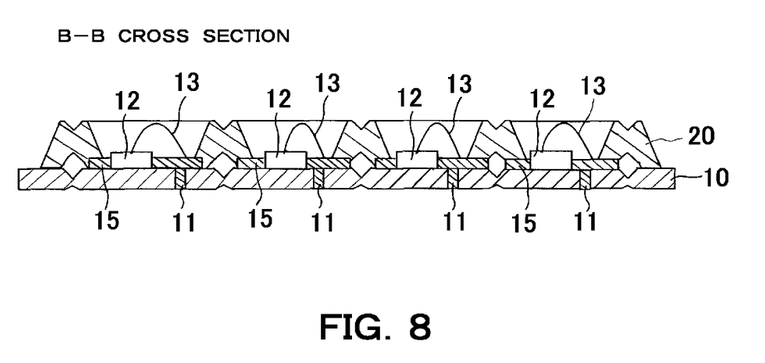
FIG. 8 is a sectional view of the line-shaped light emitting apparatus which is manufactured according to the steps as shown in FIG. 7.

Specifically, as shown in FIG. 7(b), before the dispensing step, steps for die bonding of the LED element 12 and bonding of the wire 13 are performed. Thereafter, in the dispensing step, when the insulating adhesive is injected into the insulating slit 11 by a dispenser, injection volume is increased, thereby allowing the adhesive agent to overflow from the insulating slit 11 onto the top surface of the metal plate 30. Accordingly, as shown in FIG. 8, it is possible to form an adhesive layer 15 which covers the surface of the metal plate 30 around the LED element 12. Therefore, the reflector 20 is mounted and bonded to the metal plate 30 without the extra step to apply the adhesive agent on the surface of the metal plate 30, thereby simplifying the manufacturing step.

In the dispensing step, the injecting work is performed in such a manner that the dispenser does not come into contact with the bonding wire 13. By way of example, the insulating adhesive agent may be injected from the backside of the metal plate 30.

Since other steps shown in FIG. 7(a), FIG. 7(e), and FIG. 7(f) are the same as those in FIG. 2(a), FIG. 2(e), and FIG. 2(f) of the first embodiment, tedious explanations will not be made.

Third Embodiment

In the first embodiment, the LED element 12 is die-bonded by using the adhesive resin, but the method of die bonding is not limited to such usage of the adhesive agent. In the third embodiment, there will be explained a case where die bonding is performed by eutectic bonding.

Figure 9:
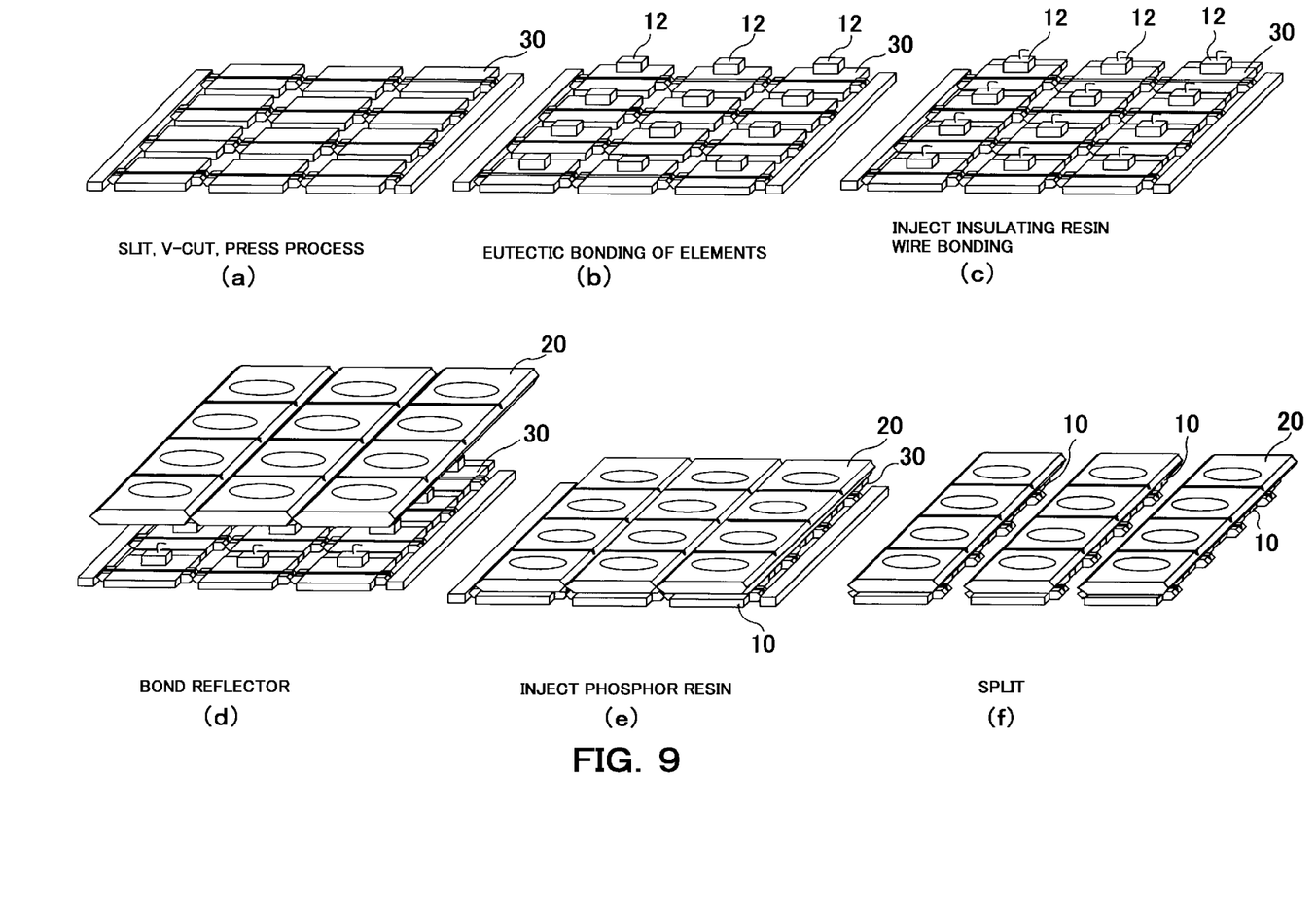

When eutectic solder (e.g., AuSn alloy) is used for the die bonding, it is necessary to heat the solder up to 180° C. or higher so as to melt the solder. Therefore, if the die bonding is performed after injecting the insulating adhesive agent into the insulating slit 11, there is a possibility that the heat may cause deterioration (e.g., discoloration or exfoliation of resin). In the third embodiment, die bonding of the LED element 12 is performed before the dispensing step. Firstly, in the step as shown in FIG. 9(b), the die bonding is performed by using the eutectic solder, and thereafter in the step as shown in FIG. 9(*c*) the insulating adhesive agent is injected into the insulating slit 11. Subsequently the wire 13 is bonded.

According the steps as described above, it is possible to use solder for the die-bonding of the LED element 12.

It is to be noted that in the third embodiment, since the steps as shown in FIG. 9(*a*), FIG. 9(*d*), FIG. 9(*e*), and FIG. 9(*f*) are the same as those in FIG. 2(*a*), FIG. 2(*d*), FIG. 2(*e*), and FIG. 2(*f*), tedious explanations will not be made.

The LED light emitting apparatus of the present invention described above may substitute for a fluorescent lamp to be used as an illuminating device. This apparatus may be applicable as a vehicle-equipped light source, such as ahead lamp, rear combination lamp, indoor lighting, and turn lamp, and also as a light source for reading used in a copy machine.

What is claimed is:

1. A method for manufacturing a light emitting apparatus, comprising the steps of:
    preparing a mounting plate as a metal plate on which at least one joint slit made up of a joint and an opening is provided in a predetermined direction, the joint configured to integrate multiple mounting plates of multiple light emitting apparatuses,
    mounting multiple light emitting elements on the metal plate in such a manner as set in array,
    fixing a reflector, which is plate-like and made of resin to be mounted on the metal plate in a superimposed manner, the plate-like reflector being provided with an aperture at a position corresponding to a position for mounting each of the multiple light emitting elements on the metal plate, and having a first reflector splitting groove formed on a position coinciding with the joint slit of the metal plate, and
    breaking the metal plate and the plate-like reflector being superimposed and fixed one on another, along the joint slit of the metal plate and the first reflector splitting groove of the plate-like reflector.

2. The method for manufacturing the light emitting apparatus according to claim 1, wherein,
    a plate splitting groove is formed on the metal plate in a direction orthogonal to the joint slit, and
    a second reflector splitting groove is formed on the plate-like reflector at a position coinciding with the plate splitting groove, and
    the method further comprises a step of splitting along the plate splitting groove and the second reflector splitting groove.

3. The method for manufacturing the light emitting apparatus according to claim 2, wherein,
    the first reflector splitting groove and/or the second reflector splitting groove are formed from both faces of the plate-like reflector, each being a V-shape groove.

4. The method for manufacturing the light emitting apparatus according to claim 2, wherein,
    in the step of breaking, any one of the plate splitting groove and the joint slit is selected for the breaking.

5. The method for manufacturing the light emitting apparatus according to claim 1, wherein,
    an insulating slit is formed on the metal plate to electrically separate the metal plate into two areas, and
    the method further comprises a step of filling the insulating slit with insulating resin before the step of mounting the light emitting elements, or after the mounting step and before the step of fixing the plate-like reflector.

6. The method for manufacturing the light emitting apparatus according to claim 5, further comprising a step of establishing connection via a bonding wire, between a topside electrode of the light emitting element which is mounted in the mounting step and a bonding pad which is provided in the area on the side opposed to the light emitting element, placing the insulating slit therebetween.

7. The method for manufacturing the light emitting apparatus according to claim 6, wherein,
    a region where the light emitting element and the bonding wire are arranged on the metal plate is virtually extended in the direction perpendicular to the longitudinal direction of the joint slit, so that the joint is arranged at a position that is deviated from the region being a band-like shape defined on the metal plate.

8. The method for manufacturing the light emitting apparatus according to claim 1, wherein,
    the joint is provided with a V-shaped notch at least from one face thereof, the first reflector splitting groove is formed to have a V-shape cross-section, and the plate-like reflector and the metal plate are superimposed one on another in such a manner that the notch coincides with the first reflector splitting groove.

* * * * *